US008498121B2

(12) United States Patent
King et al.

(10) Patent No.: US 8,498,121 B2
(45) Date of Patent: Jul. 30, 2013

(54) PRINTED CIRCUIT ASSEMBLY WITH DETERMINATION OF STORAGE CONFIGURATION BASED ON INSTALLED PADDLE BOARD

(75) Inventors: Ku-Jei King, Taipei (TW); Mw Wang, Dali (TW); Don Steven Keener, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 428 days.

(21) Appl. No.: 12/428,631

(22) Filed: Apr. 23, 2009

(65) Prior Publication Data

US 2009/0268390 A1  Oct. 29, 2009

(30) Foreign Application Priority Data

Apr. 23, 2008  (TW) ............................... 97114961 A

(51) Int. Cl.
H05K 7/00 (2006.01)
(52) U.S. Cl.
USPC ........................... 361/728; 361/729; 361/796
(58) Field of Classification Search
USPC ................. 361/796, 803, 728–730, 732, 752, 361/800, 721, 760, 748; 365/63, 65; 711/154, 711/161, 170–173
See application file for complete search history.

(56) References Cited

U.S. PATENT DOCUMENTS

| | | | |
|---|---|---|---|
| 5,708,848 A * | 1/1998 | Sangveraphunsiri et al. | .. 710/21 |
| 5,778,252 A * | 7/1998 | Sangveraphunsiri et al. | .. 710/21 |
| 6,573,711 B1 * | 6/2003 | Schaenzer et al. | ............ 324/210 |
| 6,996,642 B2 | 2/2006 | Apperley et al. | |
| 7,068,500 B1 * | 6/2006 | Beinor et al. | ............ 361/679.33 |
| 7,206,875 B2 | 4/2007 | Marushak et al. | |
| 7,216,195 B1 * | 5/2007 | Brown et al. | ................. 710/316 |
| 7,328,290 B2 * | 2/2008 | Leigh et al. | ................... 710/104 |
| 7,370,128 B2 * | 5/2008 | Douglas et al. | ................. 710/74 |
| 7,377,800 B2 * | 5/2008 | Gasser | .......................... 439/374 |
| 7,577,778 B2 * | 8/2009 | Ni et al. | .......................... 710/74 |
| 7,577,789 B2 * | 8/2009 | Perego et al. | ................. 711/115 |
| 7,610,447 B2 * | 10/2009 | Perego et al. | ................. 711/115 |
| 7,613,879 B2 * | 11/2009 | Cherian et al. | ................ 711/114 |
| 7,762,818 B2 * | 7/2010 | Hoang | ............................ 439/62 |
| 7,809,914 B2 * | 10/2010 | Kottomtharayil et al. | ..... 711/170 |
| 8,028,404 B2 * | 10/2011 | Hoang | .............................. 29/836 |
| 8,032,785 B1 * | 10/2011 | Brown et al. | ................. 714/6.32 |
| 2004/0215866 A1 * | 10/2004 | Peng et al. | .................... 710/306 |
| 2006/0136644 A1 * | 6/2006 | Martin et al. | ................. 710/302 |
| 2007/0094531 A1 | 4/2007 | Ni et al. | |
| 2007/0211430 A1 * | 9/2007 | Bechtolsheim | ............... 361/695 |
| 2007/0247826 A1 | 10/2007 | Grady et al. | |
| 2008/0003845 A1 * | 1/2008 | Hong et al. | ..................... 439/67 |
| 2008/0165490 A1 * | 7/2008 | Buckland et al. | ............ 361/685 |

FOREIGN PATENT DOCUMENTS

TW          200801897 A        1/2008

\* cited by examiner

*Primary Examiner* — Hung S Bui
(74) *Attorney, Agent, or Firm* — The Steadman Law Firm PLLC; Thomas E. Tyson

(57) ABSTRACT

A printed circuit assembly, along with a server and method incorporating such printed circuit assembly, are disclosed for determining a storage configuration for use in a computer system via a simple hardware change. The printed circuit assembly may comprise a paddle board slot for connection to a paddle board for determining a storage configuration; a bus coupled to the paddle board; and a southbridge coupled to the bus, the southbridge comprising signal lines coupled to the paddle board slot through the bus. The storage configuration of the printed circuit assembly may be determined via the paddle board when the paddle board is connected to the paddle board slot.

18 Claims, 7 Drawing Sheets

PRINTED CIRCUIT ASSEMBLY WITH DETERMINATION OF STORAGE CONFIGURATION BASED ON INSTALLED PADDLE BOARD

RELATED APPLICATION

This application claims priority under 35 U.S.C. §119 to Taiwanese Patent Application No. 97114961 filed Apr. 23, 2008, the entire text of which is specifically incorporated by reference herein.

FIELD OF THE INVENTION

The various embodiments described herein relate to a printed circuit assembly, in particular to a printed circuit assembly for determining a storage configuration for use in a computer system via a simple hardware change.

BACKGROUND OF THE INVENTION

Inventory forecasting, inventory management, and stock keeping unit (SKU) management costs are a significant burden to many computer system manufacturers. To satisfy a variety of markets and budgets, many computer system manufacturers offer a wide variety of computer systems to accommodate consumers. While such variety makes personal computers available to a wider spectrum of consumers, it adds complexity to the manufacturing process that, when left unaddressed, may result in quality and efficiency problems.

Various storage architectures with distinct attributes have been developed to address varying computing needs. Considering, for example, a blade server system, the architecture of such system is a fast-developing server architecture. Each blade server is composed of a system board having a storage configuration. The system board of each blade server usually includes CPUs, RAM or hard drives, and thus each blade server can be considered as an isolated server. A plurality of blade servers can be bundled in a chassis of the blade server system and share the same power supplies. The BladeCenter™ HS21 (Type 8853) and the BladeCenter™ HS21XM (Type 7995), developed by IBM, are examples of blade servers having distinct storage configurations. Each BladeCenter™ HS21 can install at most two 2.5 inch SAS (Serial Attached SCSI) hard disks, while each BladeCenter™ HS21XM can install at most one 2.5 inch SAS hard disk and one or two optional solid-state hard disks (SSD). However, neither of the blade server models mentioned above can readily install a SATA (Serial Advanced Technology Attachment) hard disk.

Accordingly, it would be advantageous to provide a flexible novel storage architecture having system hardware for determining a storage configuration for use in a variety of computer systems via a simple hardware change. Such novel storage architecture would save cost of procurement and testing and would also save cost in terms of manpower, resources, and time required for developing a mechanical structure for each different platform.

SUMMARY OF THE INVENTION

An objective of the various embodiments described herein is to provide a printed circuit assembly being able to determine a storage configuration for use in a computer system via a simple hardware change. According to an exemplary embodiment, the printed circuit assembly may comprise a paddle board slot for connection to a paddle board for determining a storage configuration; a bus coupled to the paddle board; and a southbridge coupled to the bus, the southbridge comprising signal lines coupled to the paddle board slot through the bus. A storage configuration of the printed circuit assembly may be determined via the paddle board when the paddle board is connected to the paddle board slot.

The paddle board of the printed circuit assembly according to the above described embodiment may be a SATA paddle board, and the southbridge may control a SATA hard disk by using the signal lines coupled to the paddle board slot through the SATA paddle board in response to the connection of the SATA paddle board to the paddle board slot.

Alternatively, the paddle board of the printed circuit assembly may be a SAS paddle board comprising a SAS controller, and the SAS controller may control a SAS hard disk by using SAS signal lines coupled to the paddle board slot through the SAS paddle board in response to the connection of the SAS paddle board to the paddle board slot.

According to a further exemplary embodiment, the printed circuit assembly may comprise a paddle board slot configured for connection to a paddle board; a bus coupled to the paddle board; and a storage device connector for coupling a storage device to the bus. A storage configuration of the printed circuit assembly may be determined via the paddle board when the paddle board is connected to the paddle board slot.

The printed circuit assembly according to the above described embodiment further may comprise a southbridge coupled to the bus, and the southbridge may comprise signal lines coupled to the paddle board slot through the bus. The paddle board may be a SATA paddle board. The storage device may be a SATA hard disk, and the southbridge may control the SATA hard disk by using the signal lines coupled to the paddle board slot through the SATA paddle board in response to the connection of the SATA paddle board to the paddle board slot.

Alternatively, the paddle board of the printed circuit assembly may be a SAS paddle board comprising a SAS controller. The storage device may be a SAS hard disk, and the SAS controller may control the SAS hard disk by using SAS signal lines coupled to the paddle board slot through the SAS paddle board in response to the connection of the SAS paddle board to the paddle board slot.

Alternatively, the storage device of the printed circuit assembly may be a solid-state hard disk.

An additional objective of the various embodiments described herein is to provide a server comprising an enclosure, a paddle board, a printed circuit assembly that may comprise some or all of the characteristics described above, and a storage device. The storage device may be selected from at least one of a SATA hard disk, a SAS hard disk, and a solid-state hard disk.

A further objective of the various embodiments described herein is to provide a method for determining a storage configuration for use in a computer system having a printed circuit assembly. The method may comprise providing a paddle board and connecting the paddle board to a paddle board slot of the printed circuit assembly to determine the storage configuration of the printed circuit assembly via the paddle board. The method further may comprise operatively engaging a southbridge of the printed circuit assembly with the paddle board. Furthermore, the method may comprise operatively engaging a storage device with the paddle board.

BRIEF DESCRIPTION OF THE DRAWINGS

The various embodiments will be described in detail, with reference to the following figures, wherein.

DETAILED DESCRIPTION

Figure 1:
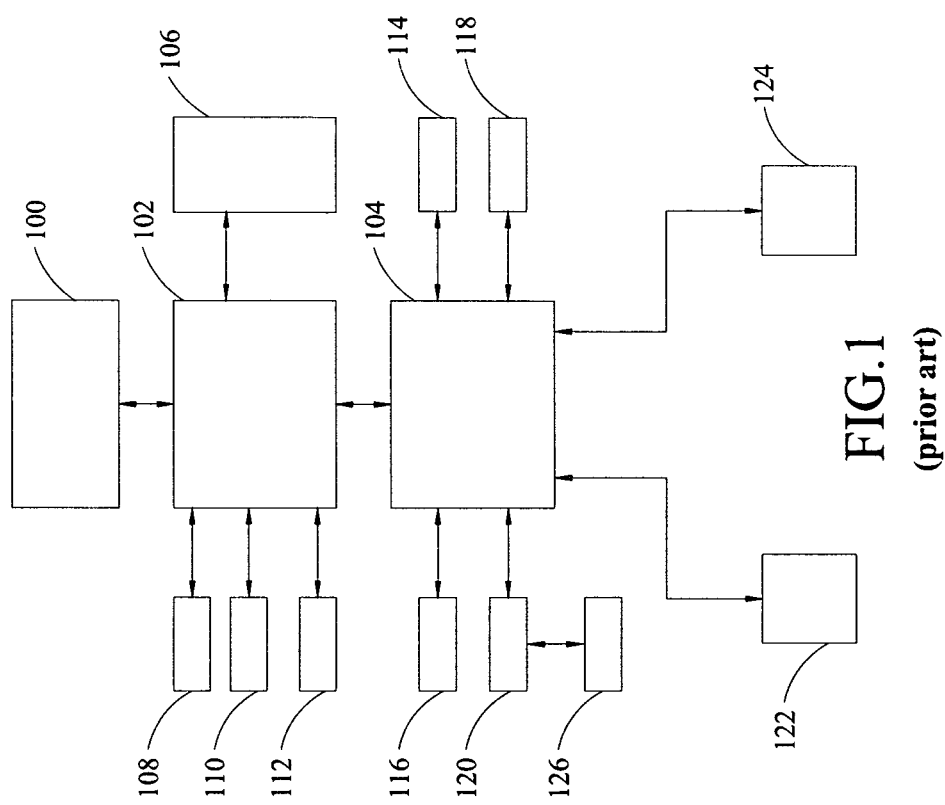
FIG. 1 depicts a block diagram of a known computer system.

The following will describe various embodiments. The various embodiments are only for illustration, and thus it will be understood by those skilled in the art that there may be many modifications and changes made therein without departing from their spirit and scope. Throughout the appended drawings, like features are identified by like reference numerals.

FIG. 1 is a block diagram of a known computer system. The computer system may comprise a processor (i.e., CPU) 100, a northbridge (e.g., memory controller hub (MCH)) 102 and a southbridge (e.g., I/O controller hub (ICH)) 104 on a system circuit board (i.e., motherboard). The MCH 102 and the ICH 104 may be components within a chipset. The processor 100 may be coupled to the MCH 102 via a host bus. The MCH 102 may be coupled to a system memory 106. In different embodiments, the processor 100 may be a multiprocessor, and the system memory 106 may be synchronous dynamic random access memory (SDRAM), double data rate SDRAM (DDR-SDRAM), Rambus DRAM (RDRAM), or one of various other formats of main system memory. The MCH 102 also may be coupled to a graphics module 108, a LAN port 110, and/or a SAS controller 112. The MCH 102 may control a SAS hard drive via the SAS controller 112. The SAS controller 112 may be a SAS controller chip of LSI™ (e.g., LSISAS1064E). In one embodiment, a graphics module may be an accelerated graphics port (AGP) graphics card or a PCI-E graphics card.

The ICH 104 may be coupled to a BIOS 114, an input/output (I/O) bus 116, a SATA hard drive 118, a baseboard management controller (BMC) 120, a keyboard controller 122, and a mouse controller 124. In different embodiments, the ICH 104 also may be coupled to any number of I/O devices, buses, and/or controllers such as a Redundant Array of Independent Disks (RAID) controller, a Peripheral Component Interface (PCI) bus, PCI-X, PCI-E, and/or a Universal Serial Bus (USB), among many others. The ICH 104 also may have a number of internal features such as internal high definition audio capabilities and power management features to conserve battery life. Additionally, a vital product data (VPD) device 126 may be coupled to the BMC 120 in order to provide a necessary machine type number.

Figure 2A:
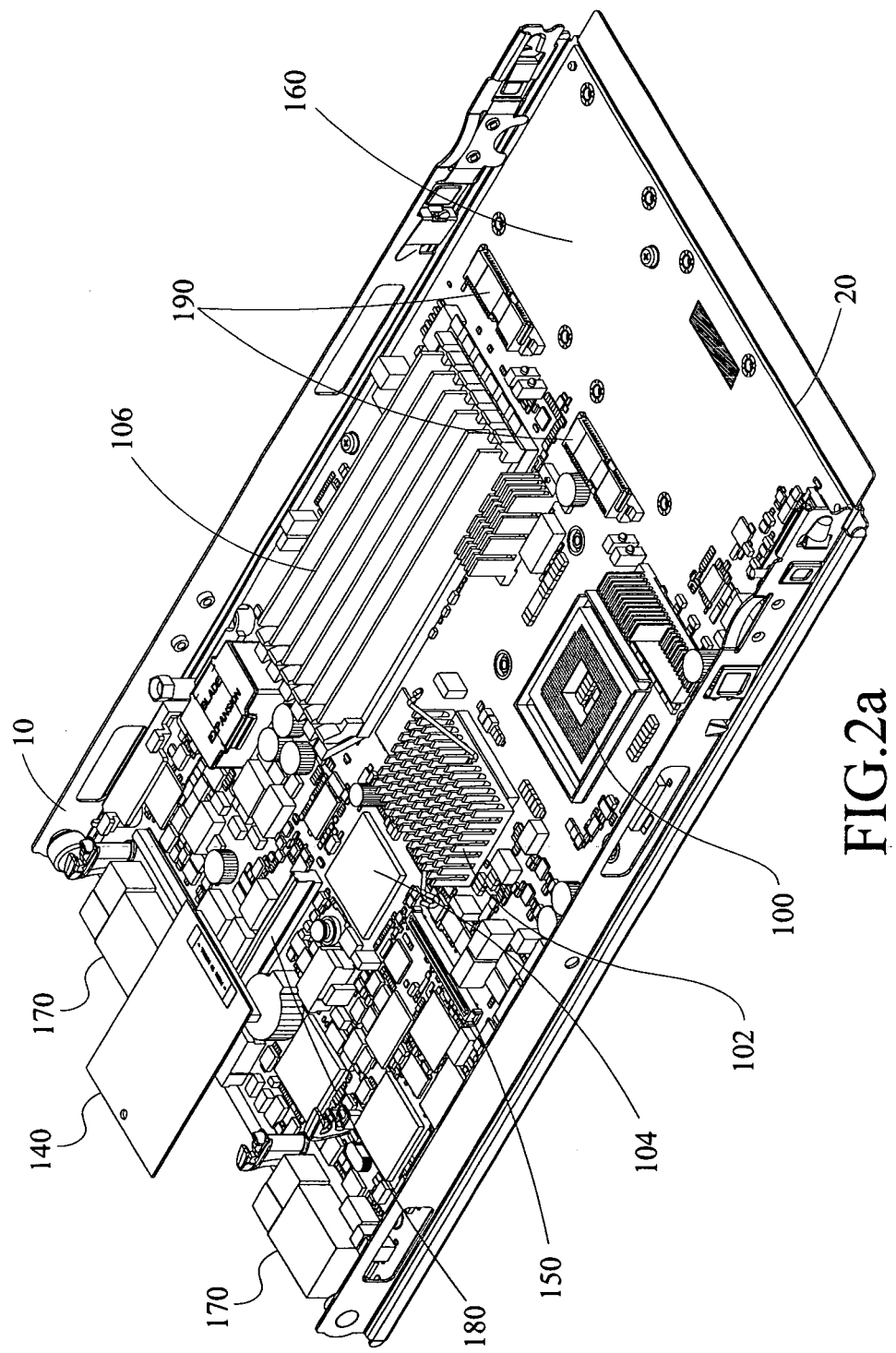
FIGS. 2a and 2b respectively depict an exploded perspective view and an assembled perspective view of a blade server having a paddle board in accordance with an exemplary embodiment.
Figure 2B:
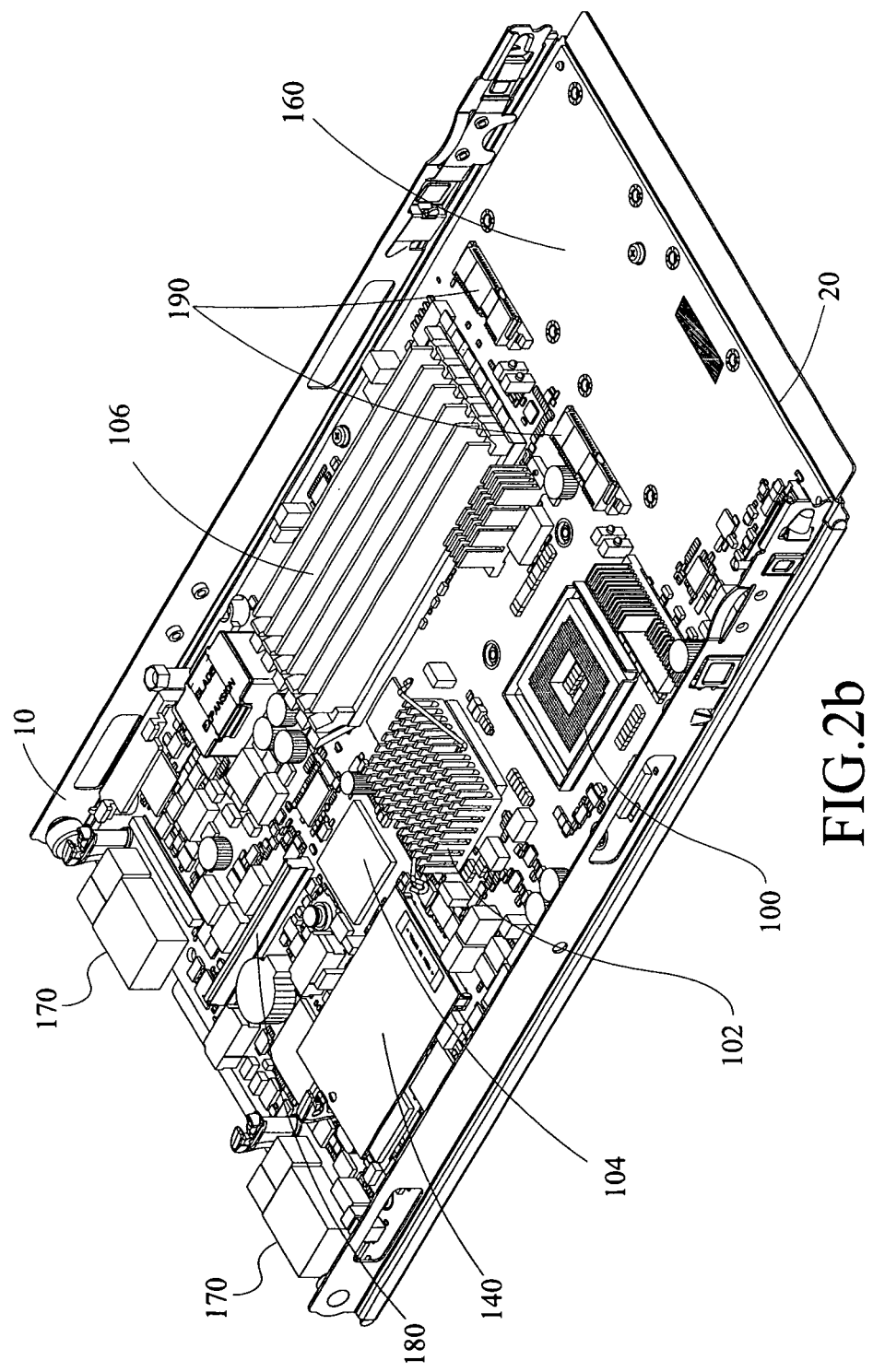

An exemplary blade server according to an exemplary embodiment is illustrated in FIGS. 2a and 2b. More specifically, FIGS. 2a and 2b respectively provide an exploded perspective view and an assembled perspective view of a blade server having a paddle board in accordance with the exemplary embodiment. The exemplary blade server may comprise a circuit board 140 (herein referred to as a "paddle board") and a printed circuit assembly (PCA) 20 within an enclosure (e.g., housing) 10. The printed circuit assembly 20 may be secured to the inside of the enclosure 10 via a plurality of screws. A hard disk region 160 and a plurality of (e.g., two) hard disk connectors 190 may be arranged on the front side of the printed circuit assembly 20. The two hard disk connectors 190 may be used for connecting two 2.5 inch SAS hard disks, two 2.5 inch SATA hard disks, or four solid-state hard disks.

As illustrated in FIGS. 2a and 2b, the printed circuit assembly (PCA) 20, which is the main board of a blade server, may comprise a variety of components, including a CPU 100 (only the CPU socket is shown), a northbridge 102, a southbridge 104 (e.g., ICH-9), a system memory 106, a paddle board slot 150, and a PCI-X slot 180. The paddle board 140 may comprise a connector 142 (see FIG. 3a) disposed thereon for insertion into the paddle board slot 150 for connection to the printed circuit assembly 20. As discussed in further detail herein, a storage configuration of the blade server may be determined via the paddle board 140. The printed circuit assembly 20 further may comprise a plurality of (e.g., two) connectors 170 disposed on the rear side thereof for coupling with a midplane (i.e., middle plane) inside a chassis of a blade server system. Such a midplane (not shown) is a system integration interface allowing the blade server to communicate with other blade servers within the blade server system via the connectors 170. The server chassis and the blade server have various configurations, standards, and sizes that should be readily apparent to those skilled in the art.

Figure 3A:
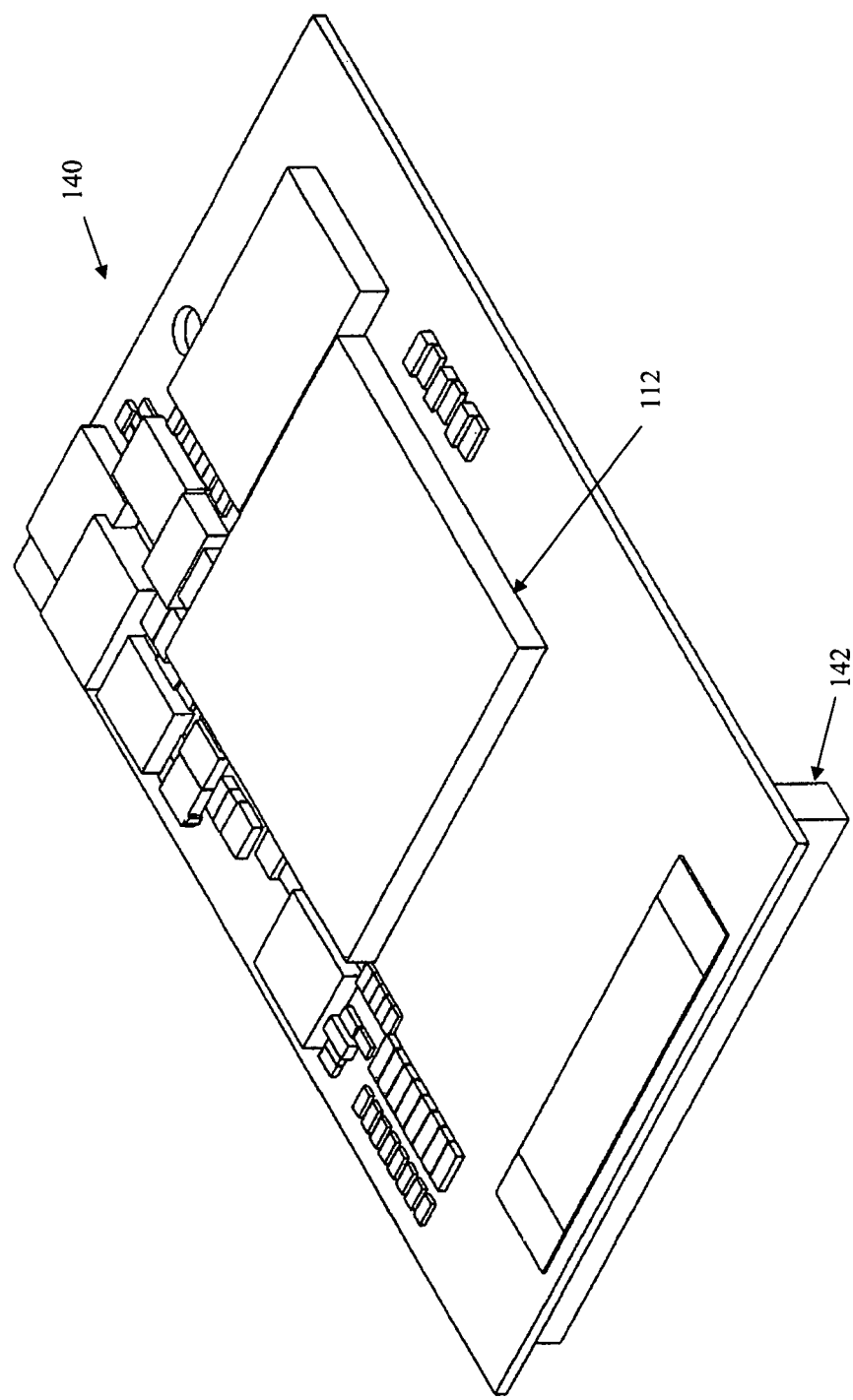
FIGS. 3a and 3b depict perspective views of two paddle board designs for determining a storage configuration of a blade server in accordance with an exemplary embodiment.
Figure 3B:
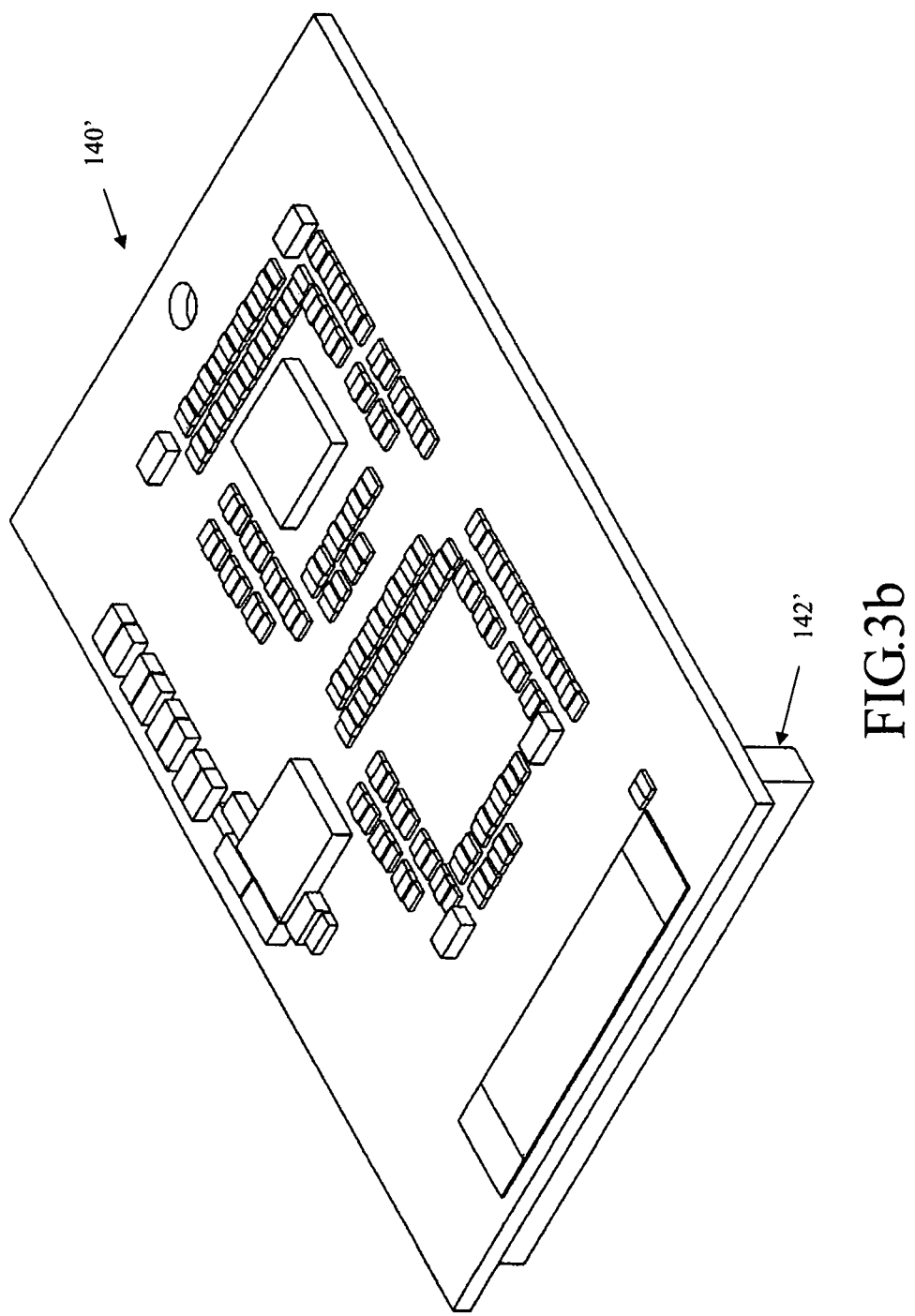

FIGS. 3a and 3b depict perspective views of two paddle board designs for determining a storage configuration of a blade server in accordance with an exemplary embodiment. As shown in FIG. 3a, a SAS paddle board 140 may comprise a connector 142, a SAS controller 112 (e.g., LSISAS1064E as mentioned above), and other peripheral circuits disposed thereon. As the connector 142 on the SAS paddle board 140 is inserted into the paddle board slot 150 on the printed circuit assembly 20 for connection, the SAS controller 112 may control the SAS hard disk installed on the hard disk region 160 and connected to the hard disk connectors 190 by using the SAS signal lines SAS-P0, SAS-P1, SAS-P2, and SAS-P3 (see FIG. 4a) coupled to the paddle board slot 150 via the connector 142 on the SAS paddle board 140. In some embodiments, the southbridge 104 may be coupled to a bus, and the signal lines SATA-P0, SATA-P1, SATA-P4, and SATA-P5 may be coupled to the paddle board slot 150 via such bus. Such bus in turn may be coupled to the SAS paddle board 140.

Similarly, as shown in FIG. 3b, a SATA paddle board 140' may comprise a connector 142' and other peripheral circuits disposed thereon. As the connector 142' on the SATA paddle board 140' is inserted into the paddle board slot 150 on the printed circuit assembly 20 for connection, the southbridge 104 disposed on the printed circuit assembly 20 may control the SATA hard disk installed on the hard disk region 160 and connected to the hard disk connectors 190 by using the signal lines SATA-P0, SATA-P1, SATA-P4, and SATA-P5 (see FIG. 4b) of the southbridge 104 coupled to the paddle board slot 150 via the connector 142' on the SATA paddle board 140'. In some embodiments, the southbridge 104 may be coupled to a bus, and the signal lines SATA-P0, SATA-P1, SATA-P4, and SATA-P5 may be coupled to the paddle board slot 150 via such bus. Such bus in turn may be coupled to the SATA paddle board 140'.

Accordingly, a different storage configuration may be determined for use in a computer system merely by changing a different paddle board in accordance with the embodiments mentioned above. Although an expensive SAS controller may be used to control a SATA hard disk, if a user wishes to install a SATA hard disk, he may directly utilize the signal lines of the southbridge 104 instead of using an expensive SAS controller, in accordance with the design depicted in FIG. 3b. As a result, the designs in accordance with the exemplary embodiment can effectively control cost and accommodate a wide variety of custom configurations, especially in the cost-sensitive low-end market. Accordingly, if there is a need to install a cheaper SATA hard disk, a SATA paddle board 140' having cheaper peripheral circuits may be used, and if there is a need to install a SAS hard disk, a SAS paddle board 140 having an expensive SAS controller may be used.

Furthermore, since the paddle boards 140 and 140' referred to above do not occupy the space of the printed circuit assembly 20, there is additional space available for accommodating other electronic components, thus increasing the flexibility of layout design on the printed circuit assembly 20.

Figure 4A:
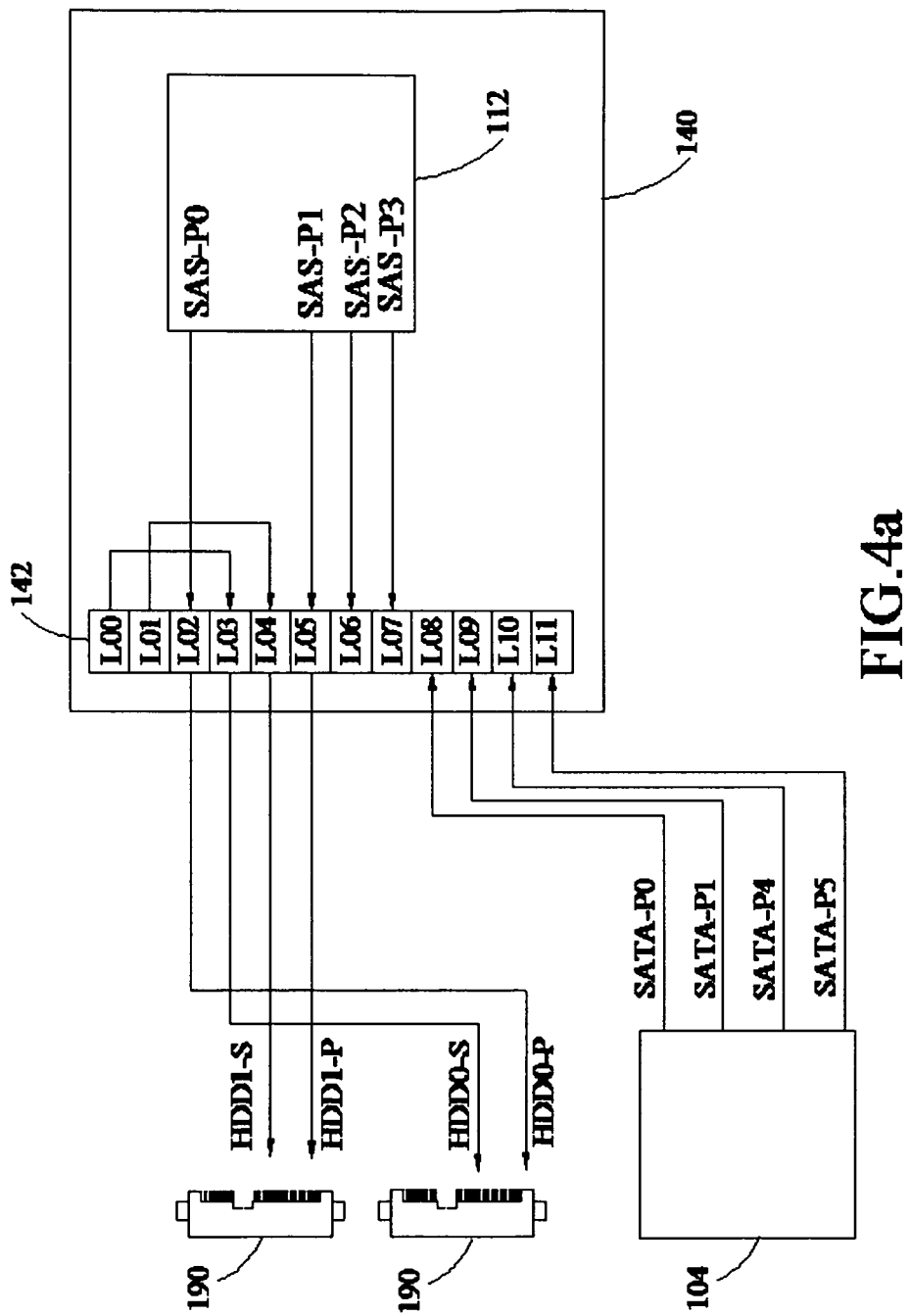
FIGS. 4a and 4b respectively depict schematic diagrams of circuits using the paddle boards illustrated in FIGS. 3a and 3b for determining a storage configuration of a blade server in accordance with an exemplary embodiment.
Figure 4B:
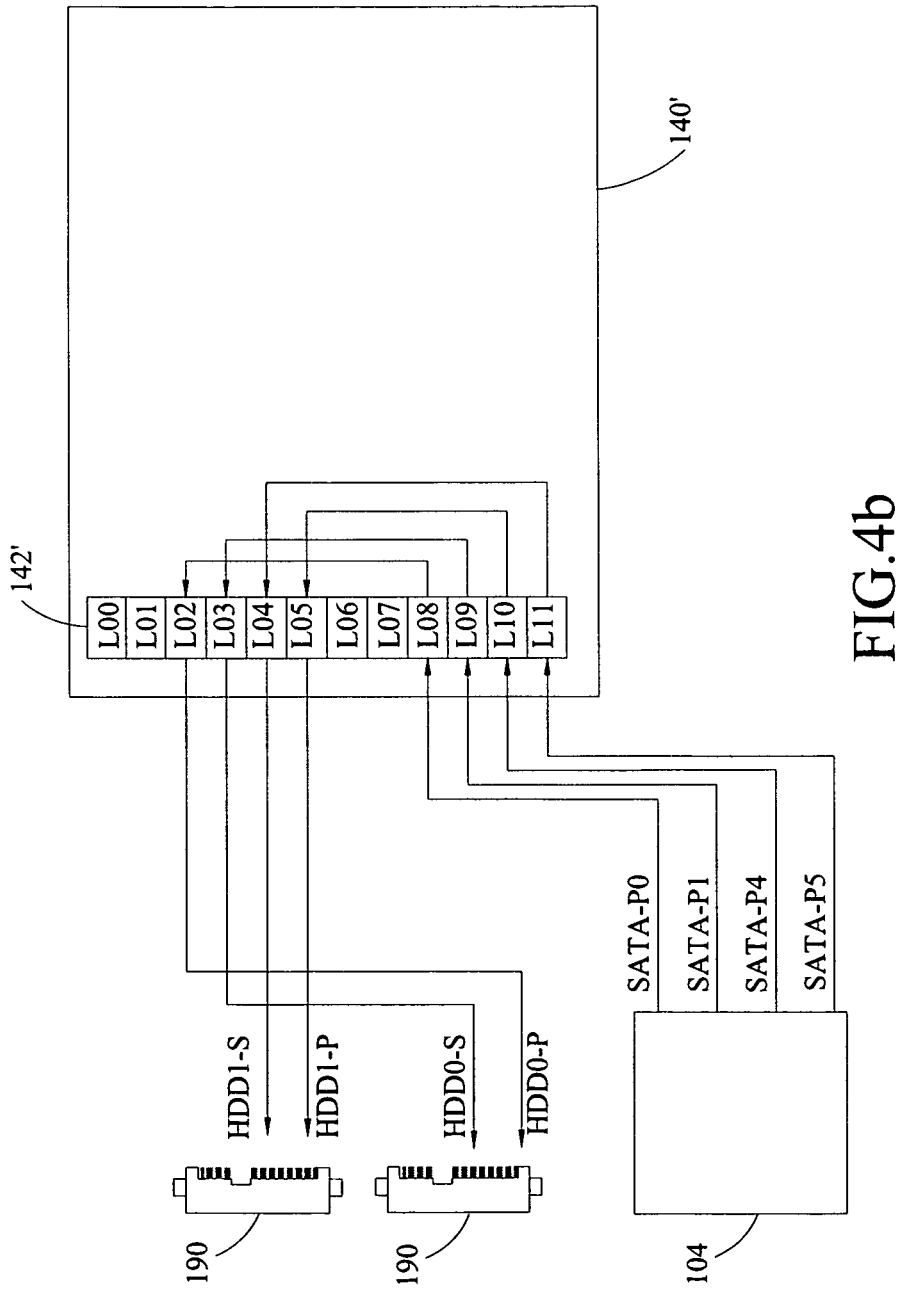

FIGS. 4a and 4b respectively depict schematic diagrams of circuits using the paddle boards illustrated in FIGS. 3a and 3b for determining a storage configuration of a blade server in accordance with an exemplary embodiment. As illustrated in FIG. 4a, a SAS paddle board 140 may comprise a connector 142 and a SAS controller 112. The connector 142 may comprise twelve pins L00-L11. The pins L02-L07 may be defined as output pins and the other pins may be defined as input pins. The SAS signal lines SAS-P0, SAS-P1, SAS-P2, and SAS-P3 of the SAS controller 112 may be respectively connected to the pins L02, L05, L06, and L07 of the connector 142. Furthermore, the SAS signal lines SAS-P0 and SAS-P1 may be respectively connected to pins HDD0-P and HDD1-P of the hard disk connectors 190 via the pins L02 and L05. Accordingly, when the connector 142 on the SAS paddle board 140 is inserted into the paddle board slot 150 on the printed circuit assembly 20 for connection, the SAS controller 112 may control the SAS hard disk installed on the hard disk region 160 and connected to the hard disk connectors 190 by using the SAS signal lines SAS-P0 and SAS-P1 coupled to the paddle board slot 150 via the connector 142 on the SAS paddle board 140. In some embodiments, the hard disk connectors 190 may be used to couple the SAS hard disk to a bus, and such bus in turn may be coupled to the SAS paddle board 140.

Referring again to FIG. 4a, the signal lines SATA-P0, SATA-P1, SATA-P4, and SATA-P5 of the southbridge 104 may be respectively connected to the pins L08, L09, L10, and L11 of the connector 142. Due to no definition on the pins L08, L09, L10, and L11 of the connector 142 on the SAS paddle board 140, there is no electrical connection between these pins and the hard disk connectors 190. Rather, the connector 142 serves as an electrical gate to allow a clean route connected to device ends in order to prevent any stubs or bus reflections detrimental to SAS/SATA signal quality from being generated as other control units from different sources are connected to the pins of the hard disk connectors 190.

Moreover, as mentioned above the SAS signals SAS-P2 and SAS-P3 may be respectively connected to pins L06 and L07 of the connector 142. The pins L06 and L07 may be used for connecting to a Pass-thru Module (e.g., Pass-thru Module of IBM BladeCenter™ series) through a SERDES (Serializer/Deserializer) card, and further connecting to a midplane inside of a server chassis through another SERDES card in order to support external storage devices. Similarly, the pins L00 and L01 of the connector 142 may be used for other expansion purposes.

As illustrated in FIG. 4b, a SATA paddle board 140' may comprise a connector 142' and other peripheral circuits. The connector 142' may comprise twelve pins L00-L11. The pins L02-L07 may be defined as output pins, and the other pins may be defined as input pins. The signal lines SATA-P0, SATA-P1, SATA-P4, and SATA-P5 of the southbridge 104 may be respectively connected to the pins L02, L03, L05, and L04 through the pins L08, L09, L10, and L11. Additionally, the SATA signal lines SATA-P0 and SATA-P4 may be respectively connected to the pins HDD0-P and HDD1-P of the hard disk connectors 190 via the pins L02 and L05. Accordingly, when the connector 142' on the SATA paddle board 140' is inserted into the paddle board slot 150 on the printed circuit assembly 20 for connection, the southbridge 104 disposed on the printed circuit assembly 20 may control the SATA hard disk installed on the hard disk region 160 and connected to the hard disk connectors 190 by using the signal lines SATA-P0 and SATA-P4 of the southbridge 104 coupled to the paddle board slot 150 via the connector 142' on the SATA paddle board 140'. Moreover, due to no definitions on the pins L00, L01, L06, and L07 of the connector 142', these pins may be used for other expansion purposes. In some embodiments, the hard disk connectors 190 may be used to couple the SATA hard disk to a bus, and such bus in turn may be coupled to the SATA paddle board 140'.

Furthermore, the hard disk connectors 190 may be used for connecting four solid-state hard disks. Specifically, there may be two sets respectively comprising two solid-state hard disks stacked together, and these two sets may be installed on the hard disk region 160. The four solid-state hard disks may be controlled by using the SATA signal lines SATA-P0, SATA-P4 and SATA-P1, SATA-P5 to respectively connect to HDD0-P, HDD1-P and HDD0-S, HDD1-S of the hard disk connectors 190 through the pins L02, L05 and L03, L04.

The connectors 142 and 142' described above with respect to the exemplary embodiments are not limited to twelve pins. The connectors 142 and 142' are exemplary in nature, and accordingly any other number of pins and definitions may be used in conformity with different needs and specifications. Moreover, the paddle boards 140 and 140' are not limited to the designs as disclosed herein. Any other type of paddle board may be used for determining a different storage configuration with reference to different needs and specifications as appropriate.

The various embodiments described herein have been presented for purposes of illustration and description and are not intended to be exhaustive or limited to the form provided herein. Accordingly, many modifications and variations will be apparent to those of ordinary skill in the art without departing from the scope and spirit of the various embodiments.

The invention claimed is:

1. A printed circuit board comprising:
   a paddle board slot for connection to a paddle board;
   a bus coupled to said paddle board; and
   a southbridge coupled to said bus, said southbridge comprising signal lines coupled to said paddle board slot through said bus;
   wherein a signal line configuration of said paddle board determines a particular storage configuration of said printed circuit board by facilitating control of a storage device installed on said printed circuit board when said paddle board is connected to said paddle board slot.

2. The printed circuit board according to claim 1, wherein said paddle board is a SATA paddle board, wherein said storage device is a SATA hard disk, and wherein said southbridge controls said SATA hard disk by using said signal lines coupled to said paddle board slot via the connection of said SATA paddle board to said paddle board slot.

3. The printed circuit board according to claim 1, wherein said paddle board is a SAS paddle board comprising a SAS controller, wherein said storage device is a SAS hard disk, and wherein said SAS controller controls said SAS hard disk by using SAS signal lines coupled to said paddle board slot via the connection of said SAS paddle board to said paddle board slot.

4. A printed circuit board comprising:
   a paddle board slot for connection to a paddle board;
   a bus coupled to said paddle board; and
   a storage device connector for coupling to said bus a storage device installed on said printed circuit board;
   wherein a signal line configuration of said paddle board determines a particular storage configuration of said printed circuit board by facilitating control of said storage device when said paddle board is connected to said paddle board slot.

5. The printed circuit board according to claim 4, further comprising a southbridge coupled to said bus, wherein said southbridge comprises signal lines coupled to said paddle board slot through said bus, wherein said paddle board is a SATA paddle board, wherein said storage device is a SATA hard disk, and wherein said southbridge controls said SATA hard disk by using said signal lines coupled to said paddle board slot via the connection of said SATA paddle board to said paddle board slot.

6. The printed circuit board according to claim 4, wherein said paddle board is a SAS paddle board comprising a SAS controller, wherein said storage device is a SAS hard disk, and wherein said SAS controller controls said SAS hard disk by using SAS signal lines coupled to said paddle board slot via the connection of said SAS paddle board to said paddle board slot.

7. The printed circuit board according to claim 4, wherein said storage device is selected from at least one of a SATA hard disk, a SAS hard disk, and a solid-state hard disk.

8. A server comprising:
   an enclosure;
   a paddle board;
   a storage device; and
   a printed circuit board mounted within said enclosure, wherein said storage device is installed on said printed circuit board, and wherein said printed circuit board comprises:
      a paddle board slot for connection to said paddle board;
      a bus coupled to said paddle board; and
      a southbridge coupled to said bus, said southbridge comprising signal lines coupled to said paddle board slot through said bus;
   wherein a signal line configuration of said paddle board determines a particular storage configuration of said printed circuit board by facilitating control of said storage device when said paddle board is connected to said paddle board slot.

9. The server according to claim 8, wherein said paddle board is a SATA paddle board, wherein said storage device is a SATA hard disk, and wherein said southbridge controls said SATA hard disk by using said signal lines coupled to said paddle board slot via the connection of said SATA paddle board to said paddle board slot.

10. The server according to claim 8, wherein said paddle board is a SAS paddle board comprising a SAS controller, wherein said storage device is a SAS hard disk, and wherein said SAS controller controls said SAS hard disk by using SAS signal lines coupled to said paddle board slot via the connection of said SAS paddle board to said paddle board slot.

11. The server according to claim 8, wherein said storage device is selected from at least one of a SATA hard disk, a SAS hard disk, and a solid-state hard disk.

12. A method for determining a particular storage configuration for use in a computer system having a printed circuit board, said method comprising:
   providing a paddle board;
   installing a storage device on said printed circuit board; and
   connecting said paddle board to a paddle board slot of said printed circuit board to determine said particular storage configuration of said printed circuit board by facilitating control of said storage device via a signal line configuration of said paddle board.

13. The method according to claim 12, further comprising operatively engaging a southbridge of said printed circuit board with said paddle board, said southbridge comprising signal lines coupled to said paddle board slot.

14. The method according to claim 12, further comprising operatively engaging said storage device with said paddle board.

15. The method according to claim 14, wherein said paddle board is a SAS paddle board comprising a SAS controller, wherein said storage device is a SAS hard disk, the method further comprising controlling said SAS hard disk by using SAS signal lines coupled to said paddle board slot via the connection of said SAS paddle board to said paddle board slot.

16. The method according to claim 12, further comprising:
   operatively engaging a southbridge of said printed circuit board with said paddle board, said southbridge comprising signal lines coupled to said paddle board slot; and
   operatively engaging said storage device with said paddle board.

17. The method according to claim 16, wherein said paddle board is a SATA paddle board, wherein said storage device is a SATA hard disk, the method further comprising controlling said SATA hard disk by using said signal lines coupled to said paddle board slot via the connection of said SATA paddle board to said paddle board slot.

18. The method according to claim 12, wherein said storage device is selected from at least one of a SATA hard disk, a SAS hard disk, and a solid-state hard disk.

* * * * *